US005896319A

United States Patent [19]
Takehana

[11] Patent Number: 5,896,319
[45] Date of Patent: Apr. 20, 1999

[54] CURRENT CONTROL CIRCUIT AND NON-VOLATILE SEMICONDUCTOR MEMORY DEVICE HAVING THE SAME

[75] Inventor: Kenichi Takehana, Kawasaki, Japan

[73] Assignee: Fujitsu Limited, Kawasaki, Japan

[21] Appl. No.: 08/976,575

[22] Filed: Nov. 24, 1997

[30] Foreign Application Priority Data

Jun. 5, 1997 [JP] Japan .................................. 9-147641

[51] Int. Cl.$^6$ .................................................. G11C 16/04
[52] U.S. Cl. ........................ 365/185.29; 365/185.33; 365/218
[58] Field of Search ................... 365/185.29, 185.33, 365/218

[56] References Cited

U.S. PATENT DOCUMENTS 5,629,893  5/1997  Tang et al. ...................... 365/185.29
5,680,348  10/1997  Chung et al. .................... 365/185.29

*Primary Examiner*—David Nelms
*Assistant Examiner*—Trong Phan
*Attorney, Agent, or Firm*—Nikaido, Marmelstein, Murray & Oram LLP

[57] ABSTRACT

A current control circuit which controls currents flowing in memory cells in a non-volatile semiconductor memory device includes a circuit which controls the currents flowing in the memory cells in an erase operation so that amounts of the currents fall within a tolerable range.

7 Claims, 7 Drawing Sheets

CURRENT CONTROL CIRCUIT AND NON-VOLATILE SEMICONDUCTOR MEMORY DEVICE HAVING THE SAME

BACKGROUND OF THE INVENTION

1. Field of the Invention

The present invention generally relates to non-volatile semiconductor memory devices of an electrically erasable type. More particularly, the present invention is concerned with a non-volatile semiconductor memory device of a batch erase type such as a flash memory device in which data stored in a plurality of memory cells can be electrically erased at one time. More specifically, the present invention relates to improvements in a circuit configuration directed to erasing data stored in memory cells at one time.

The flash memory is an electrically programmable and erasable device and can be relatively easily implemented by using the integrated circuit technology. Further, the flash memory is of non-volatile type. From these viewpoints, the flash memory is attractive and is used in various applications such as an external storage device and a portable telephone set.

2. Description of the Related Art

FIG. 1A is a cross-sectional view of a cell of a flash memory device, and FIG. 1B shows an operation thereof. Referring to FIG. 1A, a P-type semiconductor substrate 1 has $N^+$-type impurity diffused regions 2 and 3, which function as a drain and a source of the cell transistor, respectively. A channel can be formed between the drain 2 and the source 3. An insulating film (not shown) is formed on the channel. A floating gate FG is formed on the insulating film. An insulating film is formed on the floating gate FG, and a control gate CG is formed on the insulating film. In FIGS. 1A and 1B, symbols Vd, Vs and Vg respectively denote a drain voltage, a source voltage and a gate voltage.

Data can be written into the memory cell as follows. The drain voltage Vd is set to a first voltage Vp. The voltages Vd and Vp are equal to or lower than, for example, 6V (Vd= Vp=~6V). The gate voltage Vg is set to a second voltage Vpp, which is higher than the voltage Vp (>Vp). Further, the source voltage Vs is set to 0V, which is the reference potential with respect to the voltages. Hence, as indicated by *1 in FIG. 1A, electrons are injected in the floating gate FG from the drain.

Data can be erased as follows. The source voltage Vs is set to a third voltage Vcc, which is lower than the first voltage Vp and is equal to or lower than, for example, 5V. The gate voltage Vg is set to a negative voltage which is lower than 0V, and the drain is set to an open state. Hence, as indicated by *2, the electrons are drawn to the source from the floating gate FG.

Data can be read as follows. The gate voltage Vg is set to the third voltage Vcc, and the drain voltage Vd is set to a voltage equal to or lower than 1V (Vd=~1V). In this case, it is determined whether a current flows in the drain. In other words, it is determined whether the data stored in the cell is "1" or "0". The second voltage Vpp is called a write/erase voltage, and the third voltage Vcc is a read voltage.

Generally, the erase operation of the flash memory is not carried out on the cell basis but a group of cells (for example, every 64 Kbytes) are erased at one time. Such a group is called "sector". Current control circuits are provided to respective sectors. Data is erased by causing the source current to flow in the cell. In this point of view, the current control circuits are also called source current control circuits.

FIG. 2 is a block diagram of a configuration of the flash memory which employs the sector-basis erasing operation. The flash memory shown in FIG. 2 includes a plurality of sectors $10_1$ through $10_n$ where n is an integer. The sectors $10_1$ through $10_n$ respectively include cell arrays $14_1$ through $14_n$ and source current control circuits $12_1$ through $12_n$. The source current control circuits $12_1$ through $12_n$ are connected, via a wiring line 16, to a current source to which a power supply generating the third (power supply) voltage Vcc is connected. Symbols R1 through Rn denote wiring resistances of portions between the adjacent sectors.

FIG. 3 is a circuit diagram of the source current control circuit $12_1$. Each of the other source current control circuits $12_2$ through $12_n$ has the same configuration as shown in FIG. 3. The source current control circuit $12_1$ includes P-channel field effect transistors (for example, MOS transistors) MP1 and MP2, and N-channel field effect transistors (for example, MOS transistors) MN1 and MN2. An erase signal ER1 for the sector $10_1$ is applied to the gates of the transistors MP1 and MN1, which are set to a high level during the erasing operation. The current source shown in FIG. 2 is connected to the source of the transistor MP2. The drains of the transistors MP2 and MN2 are connected together and are further connected to the cell array $14_1$.

When data stored in the cell array $14_1$ are erased at one time in the batch formation, the erase signal ER for the sector $10_1$ is set to the high level. Hence, the transistor MN1 is turned ON, and the transistor MP2 is turned ON. Hence, as indicated by the thick solid line, a current I1 is supplied to the cell array $14_1$ from the current source via the transistor MP2.

However, the above prior art has the following disadvantages.

As has been described previously, the wiring line 16 have the wiring resistances R1 through Rn. Since the source current control circuits $12_1$ through $12_n$ have the same circuit configuration, the source currents I1 through In flowing in the cell arrays $14_1$ through $14_n$ have different values which depend on the wiring resistances R1 through Rn. That is, the selector $10_1$ is connected to the current source via the resistance R1, so that the largest source current I1 flows in the cell array $14_1$. In contrary, the selector $10_n$ is connected to the current source via the resistances R1 through Rn, so that the smallest source current In flows in the cell array $14_n$. That is, as shown in FIG. 4, the source currents I1, I2, I3, . . . , In have decreased values in that order. FIG. 4 shows Vs-Is (source voltage vs source current) characteristics of the source current control circuits $12_1$, $12_2$ and $12_3$, in which the horizontal axis denotes the source voltage Vs and the vertical axis denotes the source current Is.

Since the source currents Is of the sectors $10_1$ through $10_n$ have different values, different magnitudes of stress are applied to the memory cells of the memory cell arrays $14_1$ through $14_n$. The above fact causes the following problems. For example, even if the source current I1 has an amount which certainly ensures the erasing operation on the cell array $14_1$, the source current In may be insufficient to certainly ensure the erasing operation on the cell array $14_n$ during the same erasing time as that for the cell array $14_1$. If the source current In has an amount which certainly ensures the erasing operation on the cell array $14_n$, the source current I1 may excessively erase data stored in the cells of the cell array $14_1$ during the same erasing time as that for the cell array $14_n$. If the cells are excessively subjected to the erasing operation, the electrons stored in the floating gate FG are reduced. It can be seen from the above that it is necessary to change the erasing time in accordance with the amount of the source current in order to eliminate the above problems.

However, if a plurality of sectors are simultaneously subjected to the erasing operation, the above problems cannot be eliminated. For example, a plurality of sectors are subjected to the simultaneous erasing operation in a test carried out before shipping in order to reduce the test time. Even if the source currents are supplied to the sectors during the same time, the source currents supplied to the different sectors have different amounts, so that the sectors have different erased states.

If a common erasing time is defined as the erasing time necessary to obtain a desired erased state by the source current which has the smallest amount among the source currents supplied to the sectors subjected to the simultaneous erasing operation, some sectors supplied with comparatively large amounts of source currents will be excessively erased. In contact, if the common erasing time is defined as the erasing time necessary to obtain the desired erased state by the source current which has the smallest amount among the source currents supplied to the sectors subjected to the simultaneous erasing operation, some sectors supplied with comparatively small amounts of source currents will be insufficiently erased. Hence, the reliability of the flash memory will be degraded.

SUMMARY OF THE INVENTION

It is a general object of the present invention to provide a current control circuit and a semiconductor device using the same in which the above disadvantages are eliminated.

A more specific object of the present invention is to provide a current control circuit and a semiconductor device using the same in which the source currents flowing in memory cells can be appropriately controlled to obtain a substantially identical erasing time so that the erasing operation and the reliability of the semiconductor device can be improved.

The above objects of the present invention are achieved by a current control circuit controlling currents flowing in memory cells in a non-volatile semiconductor memory device, the current control circuit comprising: a circuit which controls the currents flowing in the memory cells in an erase operation so that amounts of the currents fall within a tolerable range.

The above current control circuit may be configured so that the circuit controls the currents flowing in the memory cells in an erase operation so that identical amounts of the currents flow in the memory cells.

The current control circuit may be configured so that: the memory cells are grouped into sectors; the memory cells in an identical group can be subjected to a simultaneous erasing operation; and the circuit controls the currents so that identical amounts of the currents flow in the sectors of memory cells.

The current control circuit may be configured so that the circuit controls a gate of a transistor which supplies one of the currents to corresponding memory cells.

The current control circuit may be configured so that the circuit controls gates of transistors which are respectively provided to the sectors of memory cells, the transistors supplying the currents to the sectors of memory cells.

The current control circuit may be configured so that the circuit comprises a resistor which is provided in a current path which defines a gate voltage of the transistor.

The current control circuit may be configured so that the circuit comprises resistors which are provided in current paths which define gate voltages of the transistors respectively provided to the sectors of memory cells.

The current control circuit may be configured so that the circuit comprises: a resistor which is selectively provided in a current path which defines a gate voltage of the transistor; and a gate circuit which selectively connects the resistor to the current path in accordance with an erase signal and a simultaneous erasing signal which indicates that the memory cells should be subjected to a simultaneous erasing operation.

The current control circuit may be configured so that the circuit comprises: resistors which are selective provided in current paths which define gate voltages of the transistors respectively provided to the sectors of memory cells; and gate circuits which are respectively provided to the sectors of memory cells and selectively connect the resistors to the current paths in accordance with an erase signal and simultaneous erasing signals which indicate which sectors of memory cells should be subjected to the simultaneous erasing operation.

The current control circuit may be configured so that the circuit controls, on resistances in a wiring line extending from a current source from which the currents flow, the currents flowing in the memory cells in the erase operation so that amounts of the currents fall within the tolerable range.

The above objects of the present invention are also achieved by a semiconductor memory device comprising: a memory cell array having memory cells: and a current control circuit controlling currents flowing in the memory cells, the current control circuit being configured as described above.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 5:
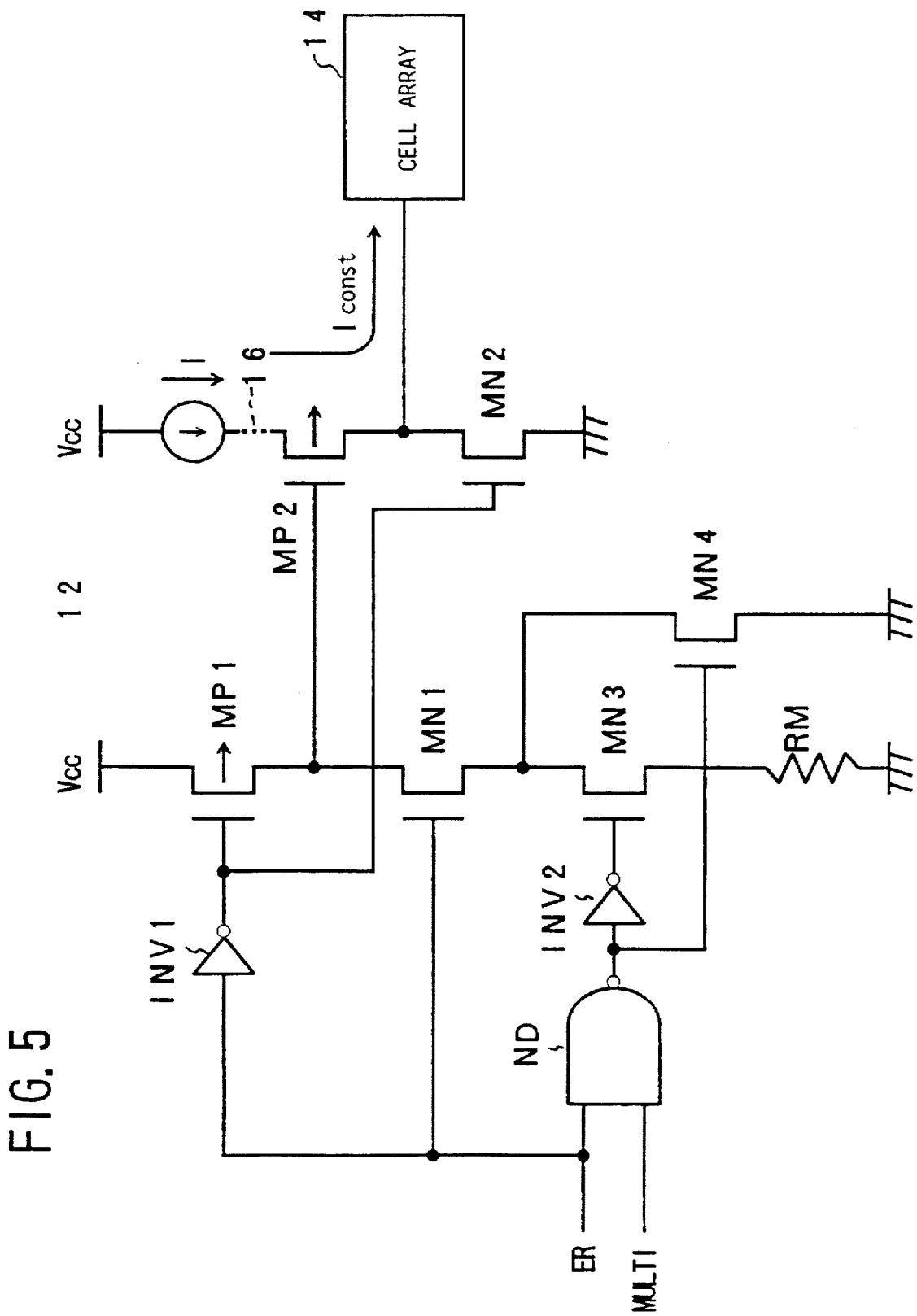
FIG. 5 is a circuit diagram of a current control circuit according to an embodiment of the present invention.

FIG. 5 is a circuit diagram of a current control circuit 12 according to an embodiment of the present invention. In which, parts that are the same as those shown in the previously described figures are given the same reference numbers.

The current control circuit 12 shown in FIG. 5 controls a source current Iconst supplied to the memory cells of a cell array 14 when erasing data stored therein. The source current control circuit 12 includes, in addition to the aforementioned transistors MP1, MP2, MN1 and MN2, N-channel field effect transistors MN3 and MN4, a pull-down resistor RM, a NAND gate ND, and inverters INV1 and INV2. The source current control circuit 12 and the cell array 14 shown in FIG. 5 is included in one sector. Source current control circuits each having the same structure as shown in FIG. 5 are replaced by the source current control circuits $12_1$ through $12_n$ shown in FIG. 2. In the following description, each of the source current control circuits $12_1$ through $12_n$ has the configuration shown in FIG. 5.

The NAND gate ND performs a NAND operation on the erase signal ER and a simultaneous erase signal MULTI which instructs a plurality of sectors to be simultaneously subjected to the erasing operation. The output signal of the NAND gate ND is output to the inverter INV2 and the transistor MN4. The output signal of the inverter INV2 is applied to the gate of the transistor MN3. The erase signal ER is applied to the gate of the transistor MN1 and the inverter INV1. The output signal of the inverter INV1 is applied to the gates of the transistors MP1 and MN2.

The erase signal ER is high during the erasing operation. In the present embodiment of the invention, an identical erasing operation time is assigned the sectors $10_1$ through $10_n$. That is, the erase signal ER applied to the sectors $10_1$ through $10_n$ is kept high during the identical time. A plurality of simultaneous erase signals MULTI are applied to the respective sectors $10_1$ through $10_n$. When some sectors among the sectors $10_1$ through $10_n$ are subjected to the erasing operation, the simultaneous erase signals ER corresponding to these sectors are set to the high level.

The pull-down resistor RM is provided in a current path extending from the power supply line Vcc to the ground via the transistors MP1, MN1 and MN3. When the transistors MP1, MN1 and MN3 are ON, a current from the power supply line Vcc flows to the ground via these transistors. The drain of the transistor MP1 and the drain of the transistor MN1 are connected together, and are further connected to the gate of the transistor MP2. The pull-down resistor RM decreases the gate voltage of the transistor MP2 and thus causes the gate/source voltage Vgs of the transistor MP2 to be at a constant level commonly defined to the sectors $10_1$ through $10_n$.

More particularly, the pull-down resistor RM is provided in order to cause the source currents I1, I2, I3, ...., In to be constant, that is, I1=I2=I3=...=Iconst. The resistance value of the pull-down resistor RM is determined by taking into the account the wiring resistance from the current source to the transistor MP2. For example, only the wiring resistance R1 is connected to the source current control circuit $12_1$, and the source current I1 is greater than the other currents I2, ...., In. The sum of the resistances R1 through Rn is connected to the source current control circuit $12_n$, and the source current In is smaller than the other source currents I1 through In−1. Hence, the source potential of the transistor MP2 in the source current control circuit $12_1$ is comparatively high, and the source potential of the transistor MP2 in the source current control circuit $12_n$ is comparatively low.

With the above in mind, the pull-down resistor RM of the source current control circuit $12_1$ is assigned a relatively large resistance in order to increase the gate potential of the transistor MP2, while the pull-down resistor RM of the source current control circuit $12_n$ is assigned a relatively small resistance in order to decrease the gate potential of the transistor MPn. Hence, the gate/source voltages Vgs of the transistors MP2 of the source current control circuits 12 of the sectors $10_1$–$10_n$ are caused to be constant so that I1=I2=I3=... =In=Iconst or I1≈I2≈I3=... ≈In≈Iconst.

Figure 4:
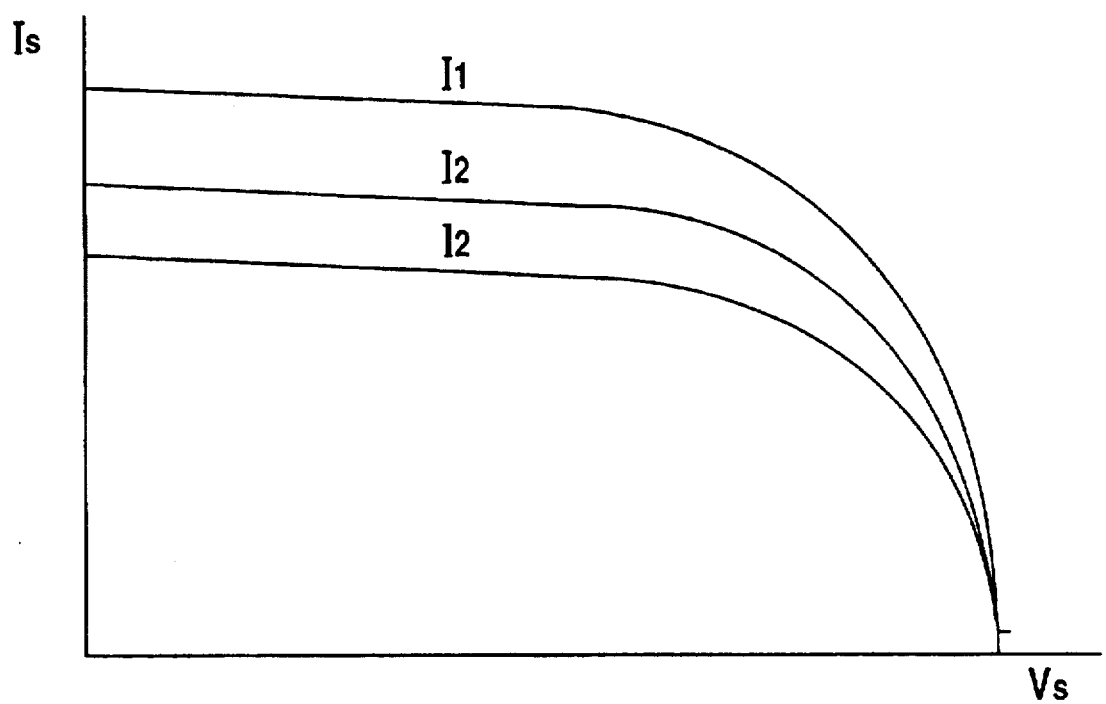
FIG. 4 is a graph showing a relationship between a source current Is and a source voltage Vs of the prior art cell transistor.
Figure 6:
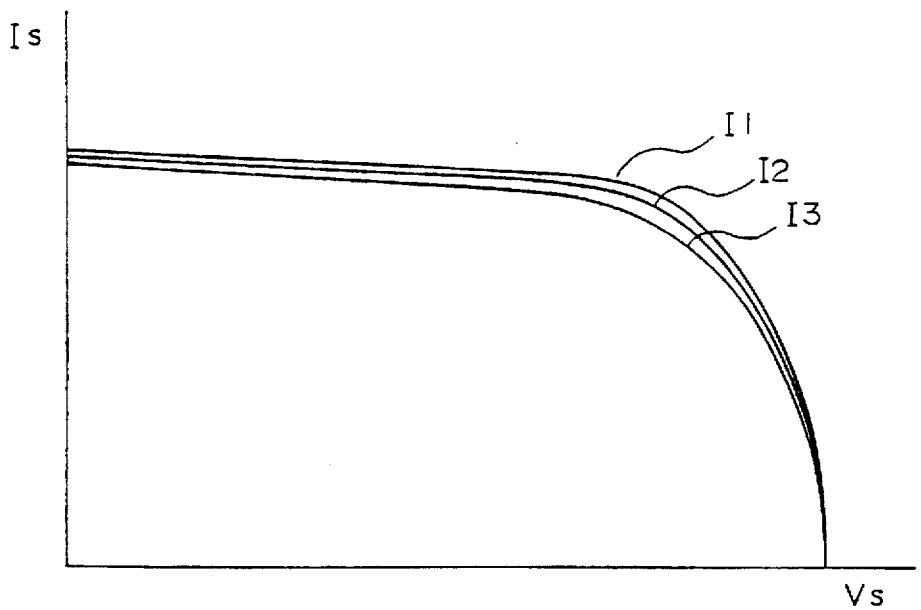
FIG. 6 is a graph showing a relationship between a source current Is and a source voltage Vs of the cell transistor in the embodiment of the present invention.

Hence, the source currents flowing to the sectors $10_1$ through $10_n$ are as shown in FIG. 6, in which only the currents I1, I2 and I3 are illustrated to facilitate comparison with FIG. 4. In FIG. 6, the horizontal axis denotes the source voltage Vs and the vertical axis denotes the source current Is. It can be seen from FIG. 6 that the currents I1, I2 and I3 have almost the same amounts. We have confirmed that the source current In supplied to the sector $10_n$ have an amount within a tolerable range.

Figure 7:
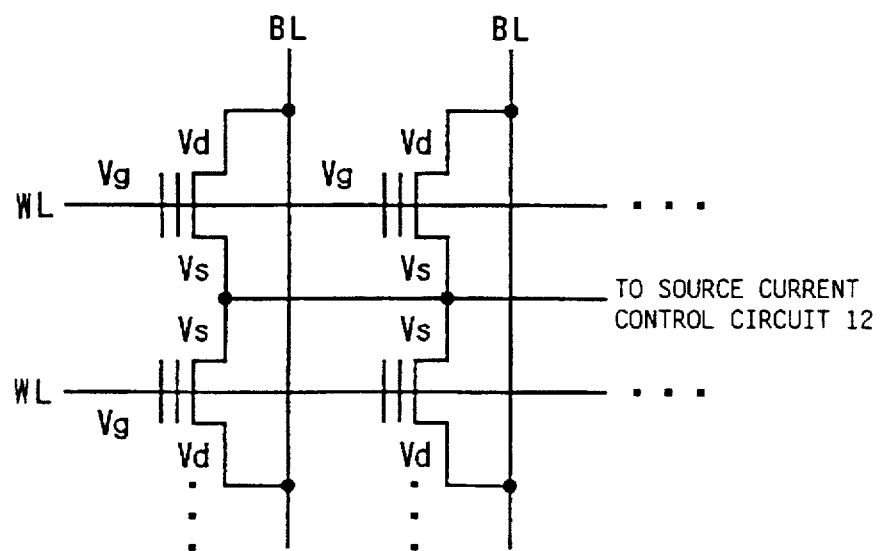
FIG. 7 is a circuit diagram of a cell array.

FIG. 7 is a circuit diagram of a part of the cell array 14. Memory cells are provided at cross points at which bit lines BL and word lines WL cross so that an array of memory cells is formed. The word lines WL are connected to the control gates CG of the cell transistors, and the bit lines BL are connected to the drain thereof. The sources of the cell transistors are connected to the drains of the transistors MP2 and MN2 of the source current control circuit 12 shown in FIG. 5.

The cell array 14 operates as follows. When the cell array 14 should be simultaneously subjected to the erasing operation together with the cell arrays of the other sectors, the corresponding simultaneous erase signals MULTI are turned ON (switched to the high level), and the erase signal ER is also turned ON (switched to the high level). Hence, the transistors MN1 and MP1 are turned ON. When the erase signal ER and the simultaneous erase signals MULTI are switched to the high level, the output signal of the NAND gate ND is switched to the low level, and the transistor MN4 is turned OFF. The output signal of the inverter INV2 which inverts the output signal of the NAND gate ND turns ON the transistor MN3.

Hence, the gate voltage of the transistor MP2 serves as the drain voltage of the transistor MN1. The drain voltage of the transistor MN1 depends on the resistance value of the pull-down resistor RM. Thus, the source current Iconst which depends on the gate/source voltage Vgs of the transistor MP2 flows in the cell array 14. That is, the electrons stored in the floating gate FG of each memory cell pass through the transistor MP2 (FIG. 5) from the source and flows into the current source. Hence, the data stored in each memory cell is erased.

When each of the sectors $10_1$ through $10_n$ is subjected to the erasing operation separately from each other, the simultaneous erasing signal MULTI is set to the low level. Hence, the output signal of the NAND gate ND is switched to the high level, and the transistors MN4 and MN3 are turned ON and OFF, respectively. Hence, the pull-down resistor RM is separated from the current path.

If it is required to set the erasing times for the sectors $10_1$ through $10_n$ to an identical time or there is a large wiring resistance, it is advantageous to carry out the simultaneous erasing operation on sectors rather than the independent erasing operation in which each sector is separately subjected to the erasing operation.

Figure 8:
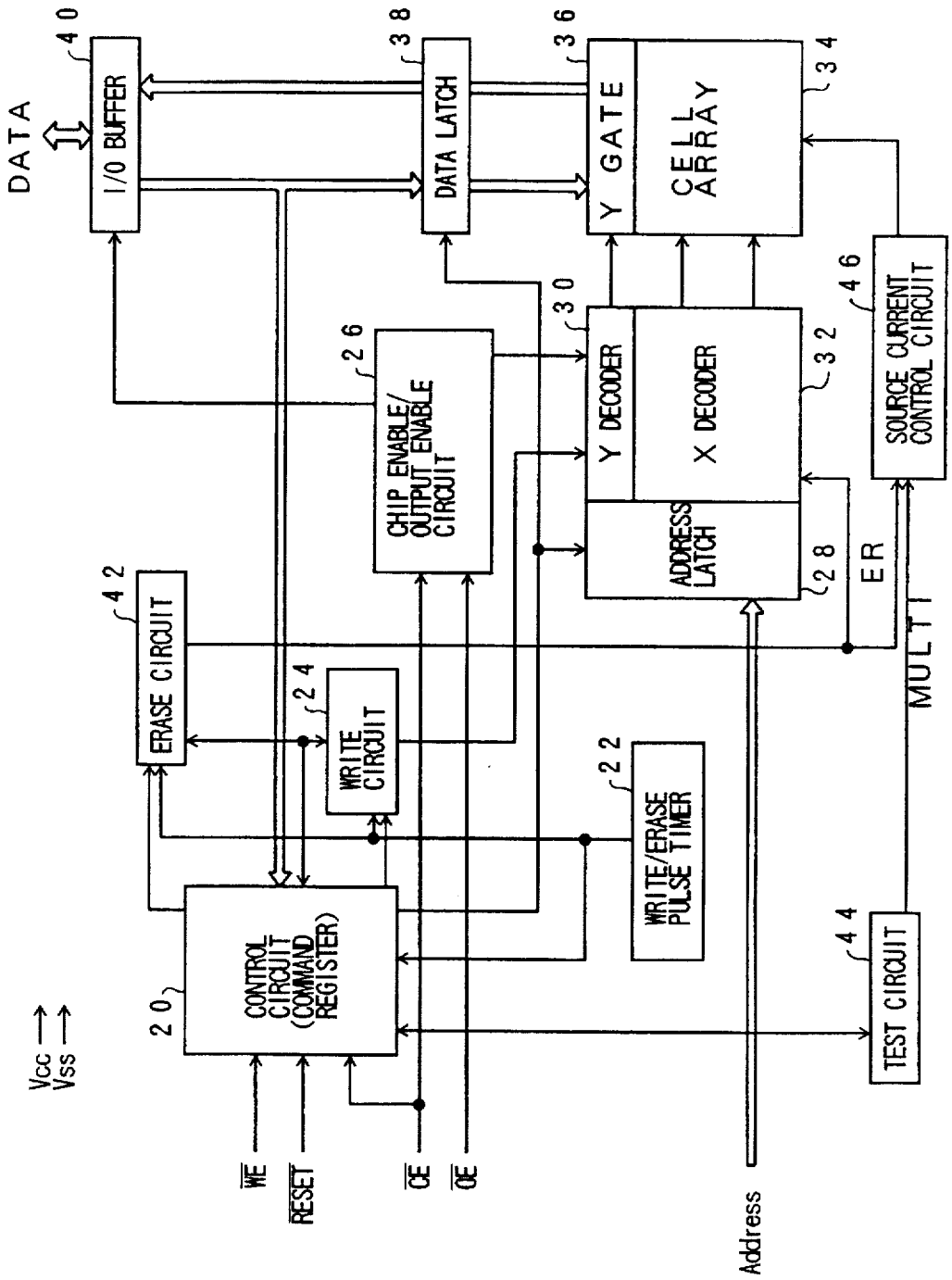
FIG. 8 is a block diagram of a non-volatile semiconductor memory device according to an embodiment of the present invention.

FIG. 8 is a block diagram of a non-volatile semiconductor memory device (flash memory device) equipped with the source current control circuit 12 according to the present invention. The memory device shown in FIG. 8 includes a control circuit 20 having a command register, a write/erase pulse timer 22, a write circuit 24, a chip enable/output enable circuit 26, an address latch circuit 28, a Y decoder 30, an X decoder 32, a cell array 34, a Y gate 36, a data latch 38, an input/output buffer 40, an erase circuit 42, a test circuit 44 and a source current control circuit 46.

Figures 1A, 1B:
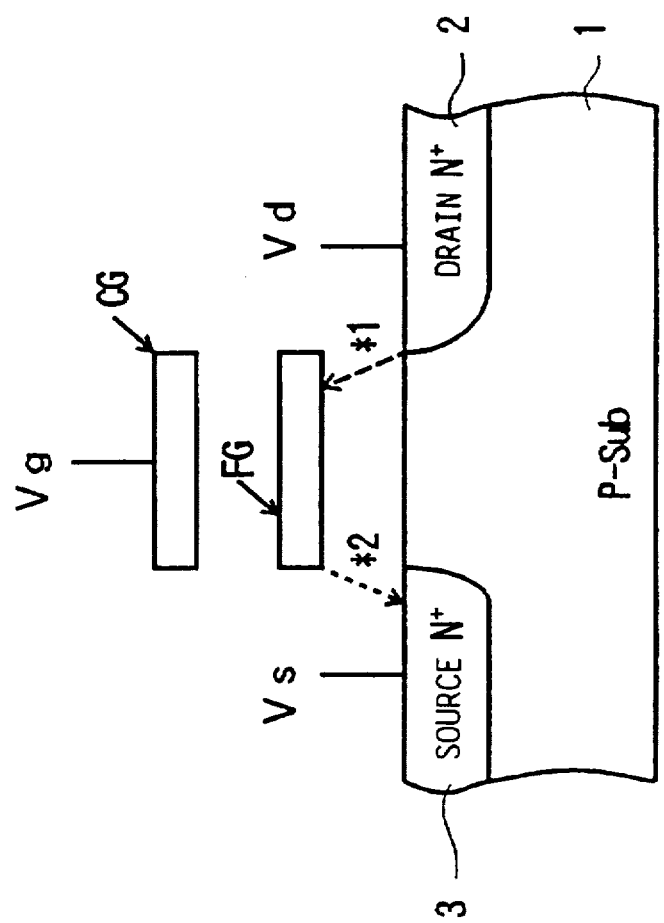
FIG. 1A is a cross-sectional view of a cell transistor of a prior art flash memory.
FIG. 1B is a diagram showing an operation of the cell transistor shown in FIG. 1A.
Figure 2:
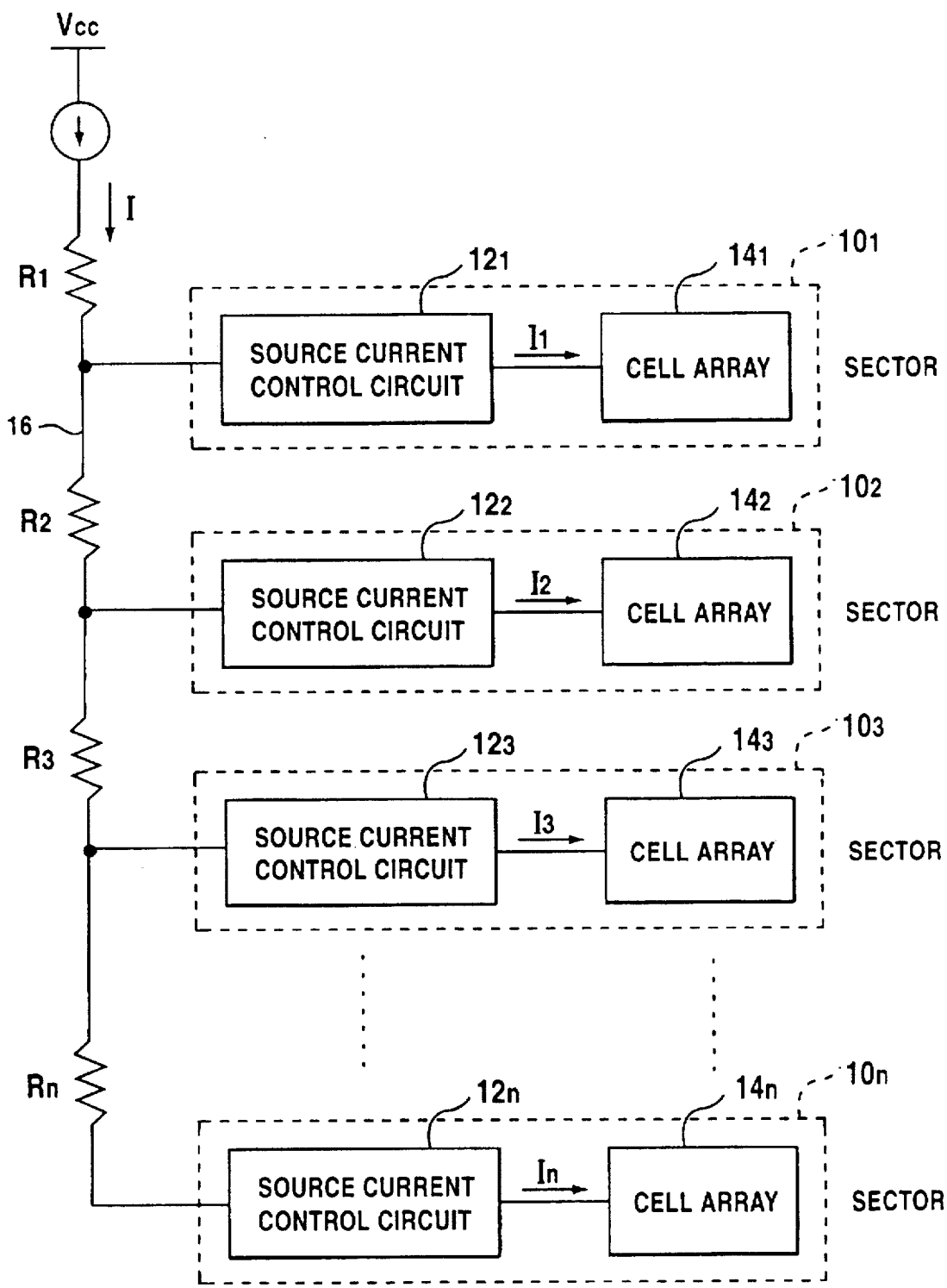
FIG. 2 is a block diagram of a prior art flash memory device having a plurality of sectors.
Figure 3:
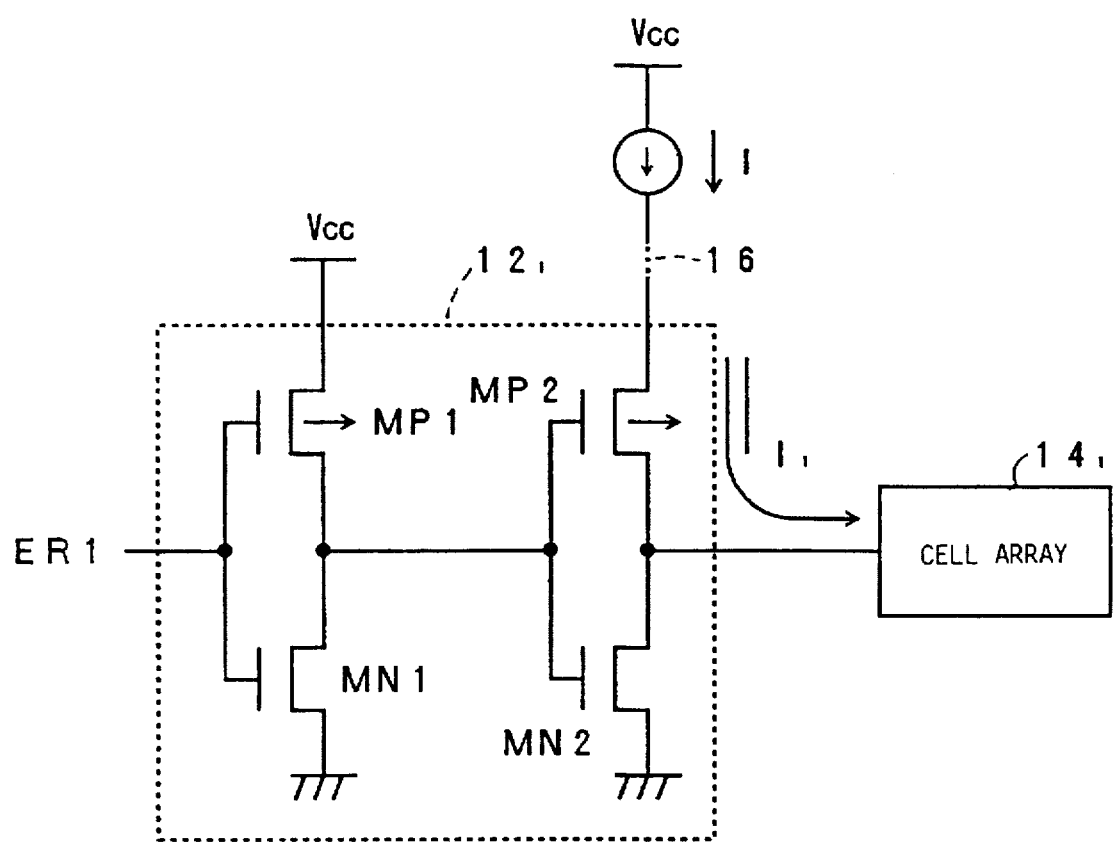
FIG. 3 is a circuit diagram of a source current control circuit provided in each of the sectors shown in FIG. 2.

As shown in FIG. 2, the cell array 34 is equipped with cell arrays $14_1$ through $14_n$ respectively provided in the sectors $10_1$ through $10_n$. The source current control circuit 46 has the source current control circuits 12 respectively provided in the sectors $10_1$ through $10_n$. The current source and the wiring line 16 shown in FIG. 5 are omitted in FIG. 8. The test circuit 44 generates, based on an instruction from the control circuit 20, the simultaneous erasing signals MULTI, which are then output to the source current control circuit 46. For example, signal lines extend from the test circuit 44 to the sectors $10_1$–$10_n$ and carry the simultaneous erasing signals MULTI thereto. The erase circuit 42 receives an instruction from the control circuit 20 and generates the erase signal ER in accordance with a timing signal from the write/erase pulse timer 22. The erase signal ER thus generated is output to the source current control circuit 46 and the X decoder 32.

The control circuit 20 receives a write enable signal /WE, a reset signal /RESET, a chip enable signal /CE and input data from the input/output buffer 40, and decodes the received signal, so that various instruction (command) signals to be applied to the internal circuits of the memory device can be generated. The write circuit 24 receives a data write instruction signal from the control circuit 20, and drives the address latch circuit 28 and the Y decoder 30 in accordance with the timing signal from the write/erase pulse timer 22. The chip enable/output enable circuit 26 receives the chip enable signal /CE and the output enable signal /OE, and drives the Y decoder 30 and the input/output buffer 40. An address signal is latched in the address latch circuit 28 driven by the control circuit 20, and is then output to the X decoder 32 and the Y decoder 30. The X decoder 32 receives a decoded signal and drives the corresponding word line in the cell array 34. The Y decoder receives a decoded signal, and drives the corresponding gate in the Y gate 36. The data latch 38 latches input data and output data based on an instruction from the control circuit 20. The input/output buffer 40 is driven by the chip enable/output enable circuit 26, and buffers the input and output data.

The selectors in the cell array 34 are subjected to the simultaneous erasing operation. The control circuit 20 decodes data input from the input/output buffer 40, and recognizes the simultaneous erasing operation on selectors. Then, the control circuit 20 notifies the test circuit 44 of sectors to be selected, and requests for the erasing operation of the erase circuit 42. Then, the erase circuit 42 outputs the erase signal ER to the source current control circuit 46 and the X decoder 32 at the timing specified by the write/erase pulse timer 22. In response to the erase signal ER, the X decoder 32 drives, for example, all of the word lines, so that the memory cells connected to the word lines are selected. The test circuit 44 outputs the simultaneous erasing signals MULTI to the corresponding sectors. The source current control circuits which receives the signals MULTI operate as has been described previously, and supplies the source currents to the corresponding cell arrays.

The read and write operations of the device shown in FIG. 8 are the same as those of the conventional device, and a description thereof will thus be omitted there.

The present invention is not limited to the flash memory devices but includes other types of non-volatile semiconductor memory devices such as an EEPROM.

The present invention is not limited to the specifically disclosed embodiments, and variations and modifications may be made without departing from the scope of the present invention.

What is claimed is:

1. A current control circuit controlling currents flowing in memory cells in a non-volatile semiconductor memory device, the memory cells being grouped into a plurality of sectors, said current control circuit comprising:

a circuit which controls, when sectors among the plurality of sectors are selected for a simultaneous erasing operation, the currents flowing in the memory cells in selected sectors based upon wiring resistances between a current source supplying the currents and the selected sectors.

2. A current control circuit controlling currents flowing in memory cells in a non-volatile semiconductor memory device, said current control circuit comprising:

a circuit which controls the currents flowing in the memory cells in an erase operation so that amounts of the currents fall within a tolerable range, wherein said circuit controls a gate of a transistor which supplies one of the currents to corresponding memory cells, and wherein said circuit comprises a resistor which is provided in a current path which defines a gate voltage of the transistor.

3. A current control circuit controlling currents flowing in memory cells in a non-volatile semiconductor memory device, said current control circuit comprising:

a circuit which controls the currents flowing in the memory cells in an erase operation so that amounts of the currents fall within a tolerable range, wherein the memory cells are grouped into sectors, the memory cells in an identical group can be subjected to a simultaneous erasing operation, the circuit controls the currents so that identical amounts of the currents flow in the sectors of the memory cells, and controls gates of the transistors which are respectively provided to the sectors of the memory cells, with the transistors supplying the currents to the sectors of the memory cells, wherein said circuit comprises resistors which are provided in current paths which define gate voltages of the transistors respectively provided to the sectors of memory cells.

4. A current control circuit controlling currents flowing in memory cells in a non-volatile semiconductor memory device, said current control circuit comprising:

a circuit which controls the currents flowing in the memory cells in an erase operation so that amounts of the currents fall within a tolerable range, wherein said circuit controls a gate of a transistor which supplies one of the currents to corresponding memory cells, and wherein said circuit comprises a resistor which is selectively provided in a current path which defines a gate voltage of the transistor; and a gate circuit which selectively connects the resistor to the current path in accordance with an erase signal and a simultaneous erasing signal which indicates that the memory cells should be subjected to a simultaneous erasing operation.

5. A current control circuit controlling currents flowing in memory cells in a non-volatile semiconductor memory device, said current control circuit comprising:

a circuit which controls the currents flowing in the memory cells in an erase operation so that amounts of the currents fall within a tolerable range, wherein the memory cells are grouped into sectors, the memory cells in an identical group can be subjected to a simultaneous erasing operation, the circuit controls the currents so that identical amounts of the currents flow in the sectors of the memory cells, and controls gates of the transistors which are respectively provided to the sectors of the memory cells, with the transistors supplying the currents to the sectors of the memory cells, and wherein said circuit comprises resistors which are selective provided in current paths which define gate voltages of the transistors respectively provided to the sectors of memory cells; and gate circuits which are respectively provided to the sectors of memory cells and selectively connect the resistors to the current paths in accordance with an erase signal and simultaneous erasing signals which indicate which sectors of memory cells should be subjected to the simultaneous erasing operation.

6. A semiconductor memory device comprising:

a memory cell array having memory cells, the memory cells being grouped into a plurality of sectors, and a current control circuit controlling currents flowing in the memory cells, said current control circuit comprising:

a circuit which controls, when sectors among the plurality of sectors are selected for a simultaneous erasing operation, the currents flowing in the memory cells in selected sectors based upon wiring resistances between a current source supplying the currents and the selected sectors.

7. The semiconductor memory device as claimed in claim 6, wherein:

the memory cells are grouped into sectors;

the memory cells in an identical group can be subjected to a simultaneous erasing operation; and said circuit controls the currents so that identical amounts of the currents flow in the sectors of memory cells.

* * * * *